US007796392B2

(12) United States Patent
Bertram et al.

(10) Patent No.: US 7,796,392 B2
(45) Date of Patent: Sep. 14, 2010

(54) ELECTRONIC CONSTRUCTION UNIT AND ELECTRICAL CIRCUIT CARRIER

(75) Inventors: Ralph Peter Bertram, Nittendorf (DE); Harald Stoyan, Regensburg (DE)

(73) Assignee: OSRAM Gesellschaft mit berschränkter Haftung, Müchen (DE)

(*) Notice: Subject to any disclaimer, the term of this patent is extended or adjusted under 35 U.S.C. 154(b) by 15 days.

(21) Appl. No.: 12/072,757

(22) Filed: Feb. 27, 2008

(65) Prior Publication Data

US 2008/0212284 A1 Sep. 4, 2008

(30) Foreign Application Priority Data

Feb. 28, 2007 (DE) .................. 20 2007 002 940 U

(51) Int. Cl.
*H05K 7/20* (2006.01)

(52) U.S. Cl. ....................... 361/712; 361/704; 361/719; 361/720; 361/762; 361/767; 165/80.3; 165/104.33; 165/185; 257/706; 257/718; 257/719

(58) Field of Classification Search ......... 361/702–712, 361/737, 743, 769, 807, 809, 812, 775; 174/15.1, 174/16.3, 252, 260, 255, 256–258, 261; 257/667, 257/691, 698, 706, 707, 711, 713, 718, 720, 257/726, 727; 165/80.2, 80.3, 80.4, 104.33, 165/104.34, 185; 29/832, 854, 829, 890.03
See application file for complete search history.

(56) References Cited

U.S. PATENT DOCUMENTS 3,689,683 A * 9/1972 Raimondo et al. .......... 174/548
3,875,478 A * 4/1975 Capstick ..................... 361/767
4,646,203 A * 2/1987 Ngo et al. .................... 361/708
4,724,514 A * 2/1988 Kaufman .................... 361/710
5,280,410 A 1/1994 Klinger et al.
5,339,217 A * 8/1994 Cohen et al. ................ 361/707
5,442,234 A * 8/1995 Liang ......................... 257/675
5,570,950 A 11/1996 Griffin
6,084,776 A 7/2000 Cuntz et al.
6,235,991 B1 * 5/2001 Johnson .................... 174/70 R
6,297,961 B1 * 10/2001 Koizumi et al. ............. 361/720
6,370,027 B1 * 4/2002 Koizumi et al. ............. 361/720
6,381,137 B1 * 4/2002 Kato et al. .................. 361/704
6,384,342 B1 * 5/2002 Li ............................. 174/258

(Continued)

FOREIGN PATENT DOCUMENTS

DE 40 12 182 10/1991

(Continued)

OTHER PUBLICATIONS

Scan12152009_145847, which is Englsh translation or German Patent DE197-518.*

*Primary Examiner*—Michael V Datskovskiy
(74) *Attorney, Agent, or Firm*—Cohen Pontani Lieberman & Pavane LLP

(57) ABSTRACT

An electronic device having an electrical circuit carrier and a body is specified, in which at least one riveted connection is formed between the electrical circuit carrier and the body. In the case of such a device, the electrical circuit carrier can be mechanically incorporated in a stable manner and with little technical complexity. An electrical circuit carrier having at least one rivet is also specified.

17 Claims, 3 Drawing Sheets

Figure 4:
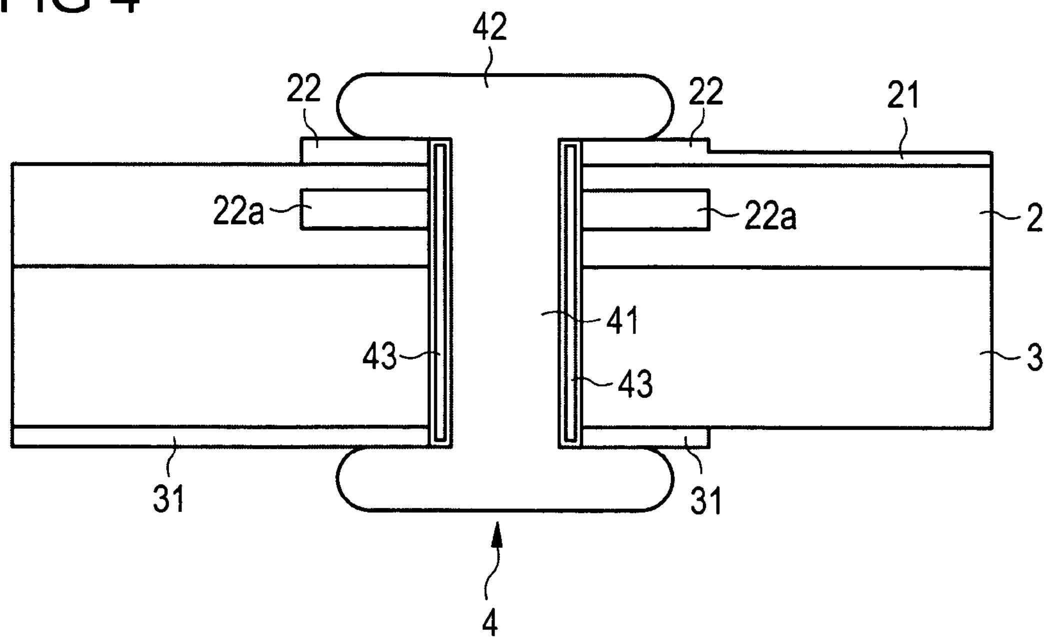

U.S. PATENT DOCUMENTS 6,395,999 B1 * 5/2002 Ploix .......................... 174/260
6,483,702 B1 * 11/2002 Lofland ...................... 361/704
6,706,964 B2 * 3/2004 Igarashi et al. .............. 174/359
6,734,368 B1 * 5/2004 Jimarez et al. .............. 174/255
6,757,171 B2 * 6/2004 Bauer et al. ................. 361/719
6,861,747 B2 * 3/2005 Miyazaki et al. ............ 257/718
6,951,467 B1 * 10/2005 Hansen ........................ 439/82
7,023,700 B2 * 4/2006 Chiou et al. ................ 361/704
7,582,959 B2 * 9/2009 Fukusako ................... 257/678
2007/0188692 A1 * 8/2007 Fukusako et al. ........... 349/150

FOREIGN PATENT DOCUMENTS

DE 195 28 632 2/1997
DE 19700518 A1 * 7/1998
DE 100 62 699 7/2002
DE 10 2005 014 605 10/2006
JP 403169059 A * 7/1991
JP 404078161 A * 3/1992
JP 2003046027 A * 2/2003
JP 2003060124 A * 2/2003

* cited by examiner

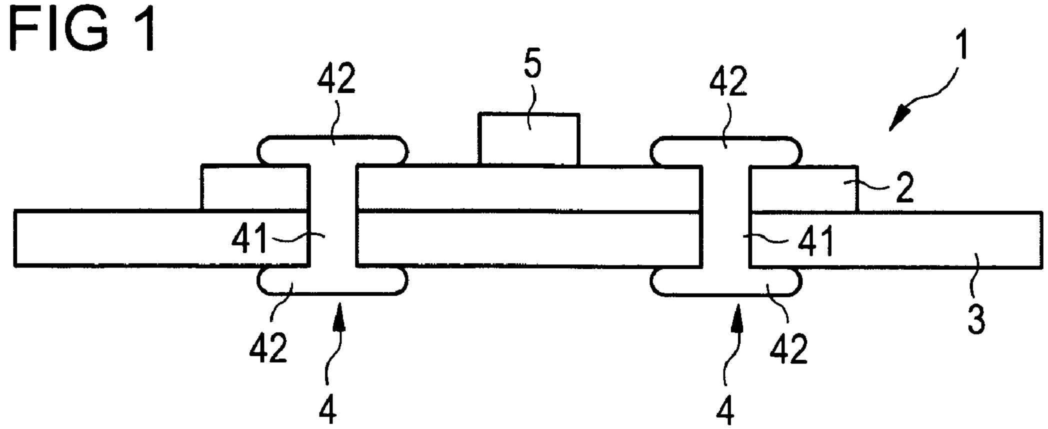
FIG 2
2
41
41
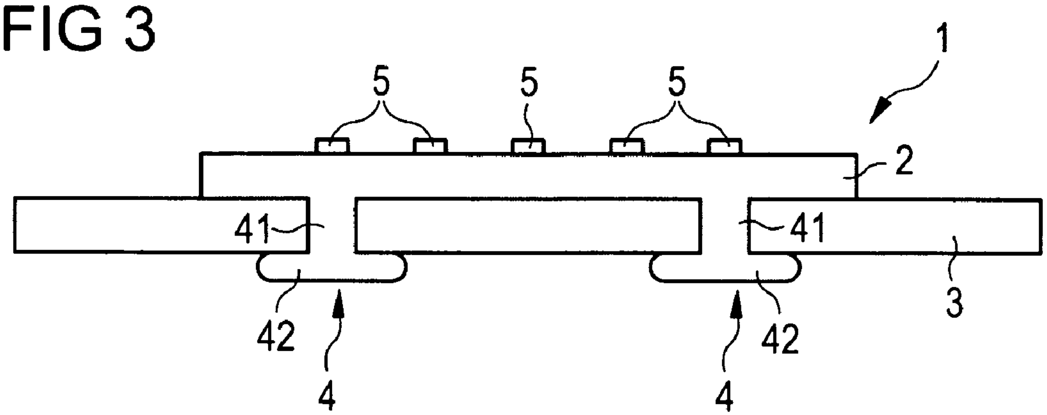

42
22
22
21
22a
22a
2
41
43
3
43
31
31
4 d
42
h
22
22
22a
22a
2
43
43
41
3
42
4

ELECTRONIC CONSTRUCTION UNIT AND ELECTRICAL CIRCUIT CARRIER

RELATED APPLICATIONS

This patent application claims the priority of German patent application no. 20 2007 002 940.3 filed Feb. 28, 2007, the disclosure content of which is hereby incorporated by reference.

FIELD OF THE INVENTION

The present application relates to an electronic device having an electrical circuit carrier and to an electrical circuit carrier.

BACKGROUND OF THE INVENTION

Electronic devices having an electrical circuit carrier in the form of a printed circuit board are known, for example. Electrical and/or electronic components can be mounted on the printed circuit board and can be electrically conductively connected to one another. Such printed circuit boards are fastened to other components of the electronic device using adhesive bonding or screwing, for example.

SUMMARY OF THE INVENTION

It is an object to provide an electronic device in which an electrical circuit carrier can be mechanically incorporated in an electronic device in a stable manner and with little technical complexity. Another object is to provide an electrical circuit carrier which is advantageous for the electronic device.

An electronic device having an electrical circuit carrier and a body is disclosed, in which at least one riveted connection is formed between the electrical circuit carrier and the body.

The electronic device can contain at least one rivet which is used to form the riveted connection. The riveted connection can be used to connect the electrical circuit carrier to the body of the device in a particularly stable manner and, if necessary, with a high pressing-on pressure. A riveted connection can additionally often be formed faster than a connection using screws, for example, with the result that the process time for producing the electronic device can be reduced.

According to one embodiment of the device, the body is a holder for the electrical circuit carrier. The riveted connection can be used to mount the electrical circuit carrier on the holder in a particularly stable manner. The electrical circuit carrier is mechanically integrated in the electronic device by means of the holder. It is preferably mounted on the holder and is held by the holder.

Additionally or alternatively, one embodiment of the electronic device provides for the body to be a heat dissipating element for the electrical circuit carrier. The heat dissipating element is more preferably a heat sink which is suitable for dissipating heat from the electrical circuit carrier and absorbing it. Additionally or alternatively, the heat dissipating element is a heat coupling element which dissipates heat from the electrical circuit carrier and forwards it in the direction of a heat sink. In this case, the heat dissipating element connects the electrical circuit carrier to the heat sink. In this case, the heat dissipating element may be simultaneously used as a first heat sink which is thermally conductively connected to a second heat sink.

Forming the body as a heat dissipating element is advantageous, in particular, when electrical devices which generate a large amount of heat during operation are mounted on the electrical circuit carrier. This may be the case, for example, with high-power luminescent diodes or transistors.

According to another embodiment, at least one part of the body is additionally or alternatively electrically conductive. It is preferably electrically conductively connected to at least one conductor track of the electrical circuit carrier. The body can thus be additionally or alternatively used to electrically connect the electrical circuit carrier.

Conductor tracks may be advantageously formed on the body. In one embodiment, the conductor tracks of the body are used to electrically drive components on the electrical circuit carrier.

In a variation, the body is electrically conductively connected to the conductor track of the circuit carrier by means of the riveted connection. In this embodiment, the riveted connection realizes not only a mechanical but also an electrical connection between the body and the electrical circuit carrier. For this purpose, at least one part of a rivet of the riveted connection is electrically conductive.

Additionally or alternatively, the body is thermally conductively connected to the conductor track of the circuit carrier or to other parts of the circuit carrier by means of the riveted connection, that is to say the riveted connection is simultaneously a thermal conductive connection between the circuit carrier and the body. If the body is a heat dissipating element, the electrical circuit carrier can thus be effectively thermally connected to the heat dissipating element in a technically simple manner. The high pressing-on pressure which can be generated by a riveted connection can be additionally advantageous in this case for a good thermal connection.

According to one embodiment of the device, the electrical circuit carrier has a printed circuit board or the electrical circuit carrier consists of a printed circuit board. Additionally or alternatively, the electrical circuit carrier advantageously has a cast circuit carrier (molded interconnected device, MID) or the electrical circuit carrier consists of a cast circuit carrier.

In one embodiment, the electrical circuit carrier has at least one rivet of the riveted connection. That is to say the electrical circuit carrier contains at least one rivet as a component, which is anchored to or in the remaining part of the circuit carrier on a first side. The rivet projects away from the remaining part of the circuit carrier on a second side which is arranged opposite the first side. Such a special circuit carrier makes it possible, in principle, to form the riveted connection in an even faster manner. It is possible, in principle, to dispense with separate rivets, although, according to another embodiment, at least one further riveted connection having at least one separate rivet may be additionally formed.

The electrical circuit carrier can have a mechanical reinforcement at least in a region from which a rivet head of a rivet of the riveted connection laterally projects. That is to say the electrical circuit carrier has greater strength at least in this region than in adjoining regions. Provision can be made for the circuit carrier to have greater strength in that region than a basic body of the circuit carrier in other regions, wherein the term basic body does not include electrical conductor tracks which might be formed on it. The mechanical connection is suitable, in particular, for preventing the electrical circuit carrier from being damaged by the riveted connection.

The mechanical reinforcement may be arranged on at least one surface of a basic body of the circuit carrier. Additionally or alternatively, at least one mechanical reinforcement may also be formed inside a basic body of the circuit carrier. An embodiment in which the mechanical reinforcement essentially extends over the entire circuit carrier is also advantageously provided.

In one embodiment, at least one part of the mechanical reinforcement is electrically conductive and is electrically conductively connected to at least one conductor track of the electrical circuit carrier.

Additionally or alternatively, at least one part of the mechanical reinforcement has a high thermal conductivity. At least this part of the mechanical reinforcement is thermally conductively connected to at least one conductor track of the electrical circuit carrier.

In one expedient embodiment, the electrical circuit carrier has at least one metal plate. The metal plate can also be advantageously used, in particular, as mechanical reinforcement. In one particular embodiment, the circuit carrier is a metal-core circuit board.

In addition or as an alternative to other features, electrically insulating material is advantageously arranged between the electrical circuit carrier and a rivet of the riveted connection in the electronic device. The electrically insulating material is suitable for electrically insulating the rivet from the circuit carrier. Particularly in the event of the rivet additionally being used as an electrical line, the insulating material can reduce the risk of the formation of a short circuit or the presence of leakage currents.

A rivet of the riveted connection preferably has, at least on one side, a rivet head having a height h and a maximum lateral extent d, where $0.04<h/d<0.5$. As a result, on the one hand, the rivet head projects away from the surface of the circuit carrier or the body as little as possible. On the other hand, a relatively large overlap between the rivet head and the surface of the body or the circuit carrier is thus formed, which is advantageous as regards a good electrical and/or thermal connection between the circuit carrier or the body and the rivet. The relationship $0.1<h/d<0.3$ applies to the rivet head. In the event of the rivet head being laterally formed in an essentially circular manner, the lateral extent is approximately the same for each lateral direction. However, the rivet head may also have any desired other shape, in particular even an asymmetrical shape.

According to at least one further embodiment, the electrical circuit carrier is part of an optoelectronic module. It is an optoelectronic module which emits electromagnetic radiation. For this purpose, at least one optoelectronic component is mounted on the electrical circuit carrier. The optoelectronic component expediently has at least one luminescent diode chip which is suitable for generating electromagnetic radiation.

An electrical circuit carrier having at least one rivet is disclosed.

According to one embodiment of the circuit carrier, the rivet projects away from the circuit carrier on a first side of the electrical circuit carrier. The electrical circuit carrier advantageously has a mechanical reinforcement on a second side opposite the first side.

In one embodiment, the electrical circuit carrier has a metal plate. The rivet of the circuit carrier preferably adjoins the metal plate. The rivet is particularly preferably integrally formed with the metal plate. Alternatively, the rivet is fastened to the metal plate in another manner.

DETAILED DESCRIPTION OF THE DRAWINGS

Figure 5:
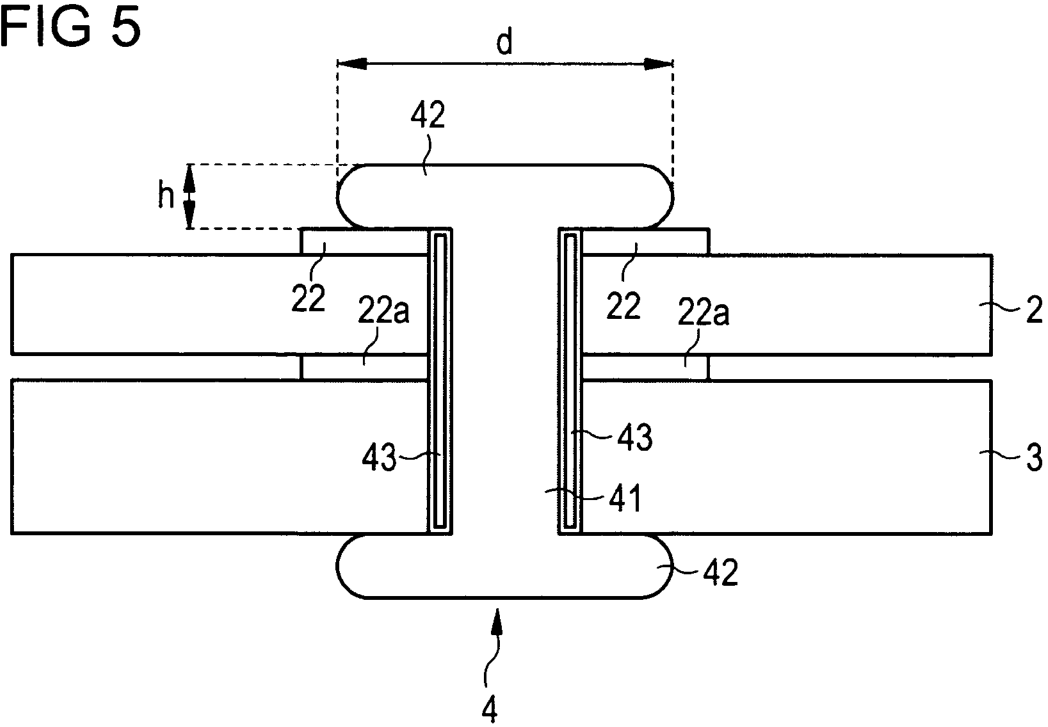
Figure 6:
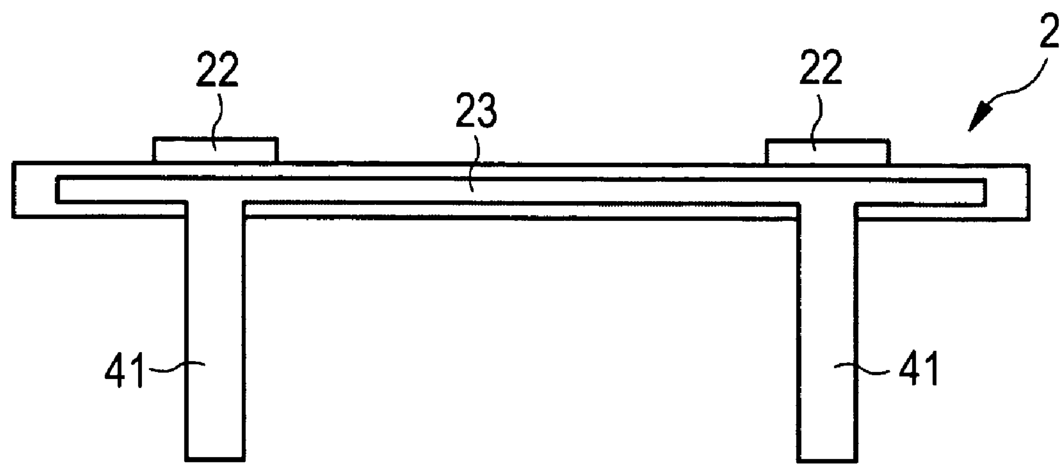
Figure 7:
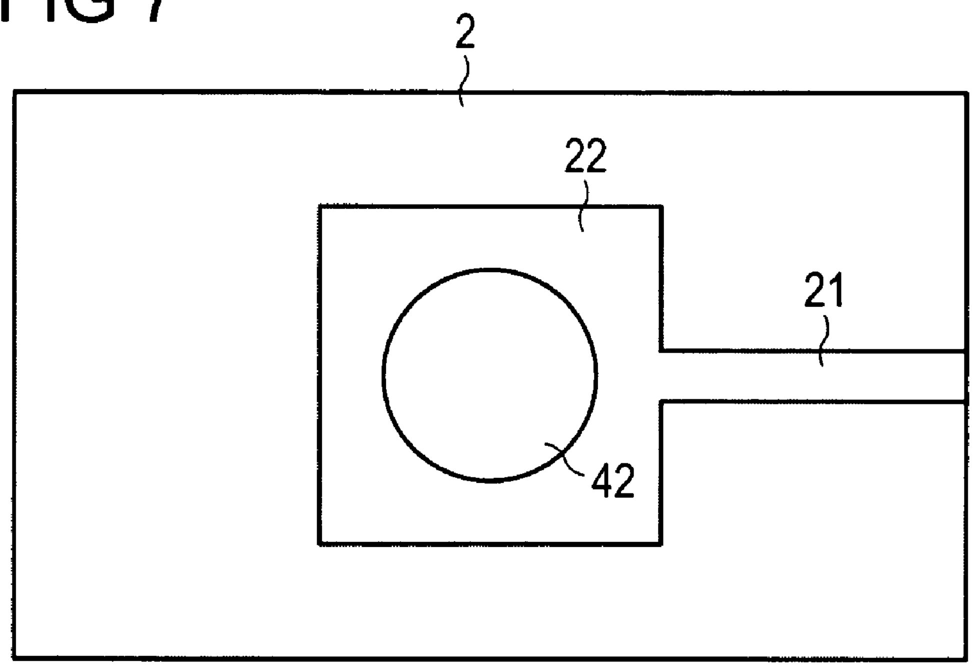

FIG. 1 shows a diagrammatic sectional view of an electronic device according to a first exemplary embodiment, FIG. 2 shows a diagrammatic sectional view of an electrical circuit carrier according to a first exemplary embodiment, FIG. 3 shows a diagrammatic sectional view of the electronic component according to a second exemplary embodiment having the electrical circuit carrier illustrated in FIG. 2, FIG. 4 shows a diagrammatic sectional view of part of the electronic component according to a third exemplary embodiment, FIG. 5 shows a diagrammatic sectional view of part of the electronic component according to a fourth exemplary embodiment, FIG. 6 shows a diagrammatic sectional view of the electrical circuit carrier according to a second exemplary embodiment, and FIG. 7 shows a diagrammatic plan view of the electrical circuit carrier 2 of that part of the device which is illustrated in FIG. 4.

DETAILED DESCRIPTION OF THE DRAWINGS

In the exemplary embodiments and figures, identical or identically acting components are each provided with the same reference symbols. The illustrated elements and the size relationships between the elements should not necessarily be considered to be true to scale. Rather, some details of the figures are illustrated in excessively large form for the sake of better understanding.

The electronic component 1 illustrated in FIG. 1 has a body 3 and an electrical circuit carrier 2. The body 3 and the electrical circuit carrier 2 are connected to one another by means of at least two riveted connections 4. For example, two or four riveted connections are included. Each riveted connection has a rivet 41 with two rivet heads 42. The electrical circuit carrier 2 and the body 3 are pressed together to a great extent using the rivet heads 42. This not only ensures a reliable mechanical connection but also makes it possible to directly thermally connect the body 3 to the circuit carrier 2 in an effective manner.

The body 3 is a holder for the circuit carrier 2. In addition, it is in the form of a heat dissipating element, for example. The body 3 is a heat sink, for example. To this end, it has thermally highly conductive material and a high thermal capacity, in particular on a side facing the circuit carrier 2. The body 3 preferably consists of thermally highly conductive material. A metal, such as aluminum or copper, or alloys containing at least one of these metals is/are suitable as the thermally highly conductive material, for example. The thermally highly conductive material is in the form of a plate, for example, having a thickness of greater than or equal to 1 cm.

Whereas metallic materials are both thermally and electrically highly conductive, materials which have a high thermal conductivity and are simultaneously electrically insulating can also be used, for example, in addition or as an alternative. Thermally conductive plastics, for example, are suitable for this purpose.

A thermally conductive plastic is, for example, a conventional thermally insulating plastic which has been provided with thermal functionalities. The thermal functionalities are provided, for example, by adding particles of thermally highly conductive materials. The particles have, for example, at least one of the materials from the group consisting of metal, carbon, graphite and ceramic material. If electrical conductivity of the material is desired, the plastic can also be additionally provided with electrical functionalities.

Instead of a thermally conductive plastic, a ceramic material, for example, is also additionally or alternatively suitable as the thermally highly conductive material. The ceramic material has, for example, aluminum nitride, aluminum oxide and/or glass ceramic or consists of at least one of these materials.

The riveted connections 4 of the device 1 illustrated in FIG. 1 have individual rivets which extend from a side of the circuit carrier 2, which faces away from the body 3, to a side of the body 3, which faces away from the circuit carrier 2. In other words, the rivets 41 extend completely through the circuit carrier 2 and the body 3.

The rivets 41 have, for example, a metallic material or consist of a metallic material. Suitable metallic materials are, for example, steel, copper, zinc, aluminum, titanium and/or alloys containing at least one of these materials.

Additionally or alternatively, the rivets 41 may also have plastic or may consist of plastic, for example.

Solid rivets, for example, are used as the rivets. However, it is alternatively also possible for at least one of the riveted connections 4 to be formed using a blind rivet or a semi-hollow rivet.

The electrical circuit carrier 2 is, for example, a metal-core circuit board. Additionally or alternatively, the circuit carrier 2 may be in the form of a printed circuit board (PCB). As an alternative to a metal-core circuit board, a plastic circuit board is suitable, for example. Glass fiber mats impregnated with epoxy resin, for example an FR4 laminate, may be used as the base material, for example.

Other materials, for example Teflon (PTFE), ceramic based on aluminum oxide, in particular based on sapphire, may likewise be suitable as a base material for the circuit board.

Alternatively, the electrical circuit carrier 2 is, for example, a cast circuit carrier (molded interconnected device, MID), in particular an injection-molded circuit carrier. An MID has a cast plastic carrier to which metallic conductor tracks are applied. In this case, the conductor tracks may, in principle, be applied to all sides of the plastic carrier and are thus three-dimensional.

At least one electrical component 5 is electrically and mechanically mounted on the circuit carrier 2. In this case, it is, for example, an optoelectronic component, for example a semiconductor component which emits electromagnetic radiation. The electronic device 1 is, for example, backlighting for an LCD screen, in particular for an LCD TV.

The electrical device 1 is preferably an optoelectronic module or preferably has an optoelectronic module. Alternatively, however, the device may also be free of optoelectronic components. For example, the electronic device 1 has, an addition or as an alternative to at least one optoelectronic component, a transistor, a non-luminescent diode, a resistor, an inductance, a capacitor and/or a thyristor.

In addition to the elements illustrated in FIG. 1, the electronic device 1 may also have further components which are not illustrated or are not explicitly mentioned in the description.

FIG. 2 illustrates an electrical circuit carrier 2 having at least two rivets 41. The rivets 41 are part of the circuit carrier 2. Production of the component 1 illustrated in FIG. 3 involves providing a body 3 and the circuit carrier 2 illustrated in FIG. 2. The body 3 has holes through which the rivets 41 of the circuit carrier 2 illustrated in FIG. 2 are inserted. The holes are round, for example, and have a larger cross-sectional area than the rivets 41.

Those parts of the rivets 41 which project from the holes are deformed by means of pressure to form rivet heads 42, with the result that the circuit carrier 2 and the body 3 are connected to one another in a form-fitting manner. The pressure can be generated using at least one blow, for example using a suitable hammer, or can be generated continuously. A press, for example a hydraulic press, is suitable for continuously generating pressure, for example.

The electronic device 1 illustrated in FIG. 3 has, for example, a plurality of optoelectronic components 5. Each optoelectronic component 5 has, for example, a luminescent diode chip which is suitable for emitting electromagnetic radiation. All or some of the optoelectronic components 5 may also consist of, for example, a luminescent diode chip which is directly mechanically and electrically mounted on the circuit carrier 2.

In that part of an electronic device which is illustrated in FIG. 4, the rivet 41 consists of electrically conductive material, for example. It has a metallic material or consists of a metallic material, for example. The riveted connection 4 is also used to simultaneously form an electrically conductive connection between an electrical conductor track 21 of the electrical circuit carrier 2 and an electrical conductor track 31 of the body 3. The electrical conductor track 21 of the circuit carrier 2 is arranged on a side of the circuit carrier 2 which faces away from the body 3. The electrical conductor track 31 of the body 3 is arranged on a side of the body 3 which faces away from the circuit carrier 2.

The circuit carrier 2 has a mechanical reinforcement 22 on its surface, for example. The reinforcement 22 is arranged in a region which adjoins the hole for the riveted connection 4. It is electrically conductive and is electrically conductively connected to the conductor track 21. The mechanical reinforcement 22 arranged on the surface of the circuit carrier 2 may be formed from the same material as the electrical conductor track 21. The mechanical reinforcement 22 is in the form of layers and has a greater thickness than the electrical conductor track 21.

FIG. 7 illustrates a diagrammatic plan view of the circuit carrier 2 which is illustrated in FIG. 4 and has the rivet head 42, the reinforcement 22 and the electrical conductor track 21. The reinforcement 22 has a polygonal shape but may also have any other desired shape in plan view.

In addition to the mechanical reinforcement 22 applied to the surface of the circuit carrier 2, the circuit carrier 2 may also have a further mechanical reinforcement **22*a* in its interior. This is formed by a metal plate, for example. However, it may be formed from any other desired material which has a higher degree of stability than the material from which the basic body of the circuit carrier 2 is formed. The mechanical reinforcements 22 and 22*a* are both arranged in a region from which the rivet heads 42 of the rivet 41 laterally project, that is to say the mechanical reinforcement at least partially laterally overlaps a rivet head 42** of the rivet.

The riveted connection 4 is also simultaneously used as electrical through-plating. The rivet 41 may be partially encased using an electrically insulating material 43. The electrically insulating material 43 is, for example, a plastic film which largely electrically insulates the rivet 41 from the circuit carrier.

In the exemplary embodiment explained using FIG. 4, the body 3 may also be free of an electrical conductor track 31, for example, and instead may be formed overall from an electrically conductive material, for example. The electrical conductor track 31 or the body 3 acts, for example, as an anode or a cathode of luminescent diode chips which are arranged on the circuit carrier 2. That is to say an anode side or a cathode side of luminescent diode chips which are arranged on the circuit carrier 2 is electrically conductively connected to the body 3, for example.

In that part of a device 1 which is illustrated in FIG. 5, the electrical circuit carrier 2 has two mechanical reinforcements 22 and **22*a*. The mechanical reinforcements 22 and 22*a* are arranged on opposite sides of a basic body of the electrical circuit carrier 2. They have a metallic material or a plastic, for example, or consist of one of these materials. If a plastic is used for the mechanical reinforcements 22 and 22***a*, it can be provided with thermally or electrically conductive functionalities by adding suitable particles.

The riveted connection 4 also simultaneously forms a thermal connection between the circuit carrier 2 and the body 3.

The rivet 41 of the riveted connection 4 has, at least on the side of the circuit carrier 2, a rivet head 42 which is particularly flat and has a large lateral extent. The ratio of the height h to a maximum lateral extent d of the rivet head 42 is, for example, 0.15, 0.18 or 0.2. The ratio can also be 0.35 or 0.4, for example.

In the electrical circuit carrier 2 illustrated in FIG. 6, the basic body has a continuous metal plate 23 from which at least two rivets 41 project. Alternatively, the circuit carrier 2 has only one single rivet 41, for example. However, it is also advantageously possible for the circuit carrier to have more than two rivets 41, for example four rivets. The rivets 41 are integrally formed with the metal plate 23, for example.

The circuit carrier 2 is a type of metal-core circuit board, for example. The metal plate 23 already significantly reinforces the basic body of the circuit carrier 2. In addition, at least one mechanical reinforcement 22 may be arranged on a side of the circuit carrier 2 which faces away from the rivets 41. For example, a mechanical reinforcement 22 is preferably arranged opposite each rivet 41. A plurality of mechanical reinforcements 22 may also be connected to one another, with the result that there is only a single mechanical reinforcement rather than a plurality of reinforcements, for example.

The invention is not restricted to the exemplary embodiments by virtue of the invention being described using the latter. Features explained using an exemplary embodiment can be combined with other exemplary embodiments as desired. The invention comprises any new feature and any combination of features, which comprises any combination of features in the patent claims in particular, even if this feature or this combination itself is not explicitly stated in the patent claims or exemplary embodiments.

We claim:

1. An electronic device including an electrical circuit carrier and a body, wherein at least one riveted connection is formed between the electrical circuit carrier and the body, wherein the electrical circuit carrier includes at least one rivet of the riveted connection, wherein the at least one rivet is an integral part of the electrical circuit carrier, and wherein at least one part of the body is electrically conductively connected to at least one conductor track of the electrical circuit carrier.

2. The electronic device as claimed in claim 1, wherein the body is a holder for the electrical circuit carrier.

3. The electronic device as claimed in claim 1, wherein the body is a heat dissipating element for the electrical circuit carrier.

4. The electronic device as claimed in claim 1, wherein the body is electrically conductively connected to the conductor track of the circuit carrier by means of the riveted connection.

5. The electronic device as claimed in claim 1, wherein the electrical circuit carrier includes a printed circuit board or a cast circuit carrier (MID).

6. The electronic device as claimed in claim 1, wherein the electrical circuit carrier includes a metal plate.

7. The electronic device as claimed in claim 1, wherein a rivet of the riveted connection includes, at least on one side, a rivet head having a height h and a maximum lateral extent d, where $0.04<h/d<0.5$.

8. The electronic device as claimed in claim 7, wherein $0.1<h/d<0.3$.

9. The electronic device as claimed in claim 1, wherein the electrical circuit carrier is part of an optoelectronic module.

10. An electrical circuit carrier including at least one rivet and a basic body, wherein the at least one rivet and a metal plate are made in one piece, and wherein the metal plate is at least partially embedded in the basic body.

11. The electrical circuit carrier as claimed in claim 10, wherein the rivet is projecting away from the circuit carrier on a first side of the electrical circuit carrier, and the electrical circuit carrier includes a mechanical reinforcement on a second side opposite the first side.

12. An electronic device including an electrical circuit carrier and a body, wherein at least one riveted connection is formed between the electrical circuit carrier and the body, wherein the electrical circuit carrier comprises a metal plate, wherein the metal plate is at least partially embedded in the electrical circuit carrier and reinforces the electrical circuit carrier, and wherein a side of the electrical circuit carrier facing towards the body is in direct contact over an entire lateral extent of the side with the body.

13. The electronic device as claimed in claim 12, wherein the metal plate is continuous.

14. The electronic device as claimed in claim 12, wherein the electrical circuit carrier includes a mechanical reinforcement at least in a region from which a rivet head of a rivet of the riveted connection laterally projects.

15. The electronic device as claimed in claim 14, wherein at least one part of the mechanical reinforcement is electrically conductive and is electrically conductively connected to at least one conductor track of the electrical circuit carrier.

16. The electronic device as claimed in claim 14, wherein at least one part of the mechanical reinforcement has a high thermal conductivity.

17. The electronic device as claimed in claim 12, wherein electrically insulating material is arranged between the electrical circuit carrier and a rivet of the riveted connection.

* * * * *